US008987608B2

(12) United States Patent
Huang et al.

(10) Patent No.: US 8,987,608 B2
(45) Date of Patent: Mar. 24, 2015

(54) CIRCUIT STRUCTURE AND MANUFACTURING METHOD THEREOF

(75) Inventors: Shang-Feng Huang, Taoyuan County (TW); Cheng-Po Yu, Taoyuan County (TW); Jen-Chi Cheng, Taichung (TW)

(73) Assignee: Unimicron Technology Corp., Taoyuan (TW)

( * ) Notice: Subject to any disclaimer, the term of this patent is extended or adjusted under 35 U.S.C. 154(b) by 259 days.

(21) Appl. No.: 13/615,722

(22) Filed: Sep. 14, 2012

(65) Prior Publication Data

US 2014/0041919 A1 Feb. 13, 2014

(30) Foreign Application Priority Data

Aug. 8, 2012 (TW) ............................ 101128625 A

(51) Int. Cl.
*H05K 1/11* (2006.01)
*H05K 1/02* (2006.01)
*H05K 3/46* (2006.01)

(52) U.S. Cl.
CPC ............ *H05K 1/0221* (2013.01); *H05K 3/4644* (2013.01); *Y10T 29/49155* (2013.01)
USPC .......................................................... 174/261

(58) Field of Classification Search
CPC ............... H05K 2201/09036; H05K 2201/093
USPC ......... 174/261, 250, 255, 260, 262, 264, 267, 174/360
See application file for complete search history.

(56) References Cited

U.S. PATENT DOCUMENTS

2009/0322450 A1 * 12/2009 Kim et al. .................... 333/204

FOREIGN PATENT DOCUMENTS

JP 2001326433 11/2001

OTHER PUBLICATIONS

"Office Action of Taiwan Counterpart Application", issued on Jun. 23, 2014, p. 1-p. 11.

* cited by examiner

*Primary Examiner* — Tremesha S Willis
(74) *Attorney, Agent, or Firm* — Jianq Chyun IP Office

(57) ABSTRACT

A circuit structure includes an inner circuit layer, a first and a second dielectric layers, a first and a second conductive material layers, and a second and a third conductive layers. The first dielectric layer covers a first conductive layer of the inner circuit layer and has a first surface and first circuit grooves. The first conductive material layer is disposed inside the first circuit grooves. The second conductive layer is disposed on the first surface and includes a signal trace and at least two reference traces. The second dielectric layer covers the first surface and the second conductive layer and has a second surface and second circuit grooves. Widths of the first and the second circuit grooves are smaller than that of the reference traces. The second conductive material layer is disposed inside the second circuit grooves. The third conductive layer is disposed on the second surface.

11 Claims, 7 Drawing Sheets

CIRCUIT STRUCTURE AND MANUFACTURING METHOD THEREOF

CROSS-REFERENCE TO RELATED APPLICATION

This application claims the priority benefit of Taiwan application serial no. 101128625, filed on Aug. 8, 2012. The entirety of the above-mentioned patent application is hereby incorporated by reference herein and made a part of this specification.

BACKGROUND OF THE INVENTION

1. Field of the Invention

The invention relates to a circuit structure and a method of manufacturing the same. In particular, the invention relates to a circuit structure having an electromagnetic shielding function and a method of manufacturing the same.

2. Description of Related Art

As the technology of manufacturing printed circuit boards (PCB) improves, the dimensions of PCBs have become smaller. Because of design requirements, not only have circuit components on a PCB increased, the transmission speed between each circuit component is required to be faster. However, for a PCB with a limited layout area having many circuit components, the distances between signal traces must be reduced. This causes cross talk between the signals traces, which affects transmission quality. If the distances between the signal traces are increased, the circuit layout area will become smaller.

Furthermore, when electric currents or voltages of electronic products vary under high frequency or high speed, the electromagnetic noise produced may be transmitted through radiation or conducting paths. This affects the signal transmission of neighboring signal traces, and requires an additional component or protection object to protect the completeness of the signal transmission of the signal traces from being affected from external electromagnetic waves. However, even though the top and bottom sides of signal traces have components or protection objects to prevent the electromagnetic waves from spreading, however, the left and right sides of the signal traces are open space. Thus, electromagnetic waves can interfere with the signal transmission of signals traces from the left and right sides of the signal traces. That is to say, the signal traces are easily interfered by electromagnetic waves, which further affect the completeness of the signal transmission.

SUMMARY OF THE INVENTION

The invention provides a circuit structure can mitigate the problems of cross talk interference and electromagnetic interference (EMI).

The invention further provides a method of manufacturing a circuit structure, adapted to manufacture the above circuit structure.

The invention provides a circuit structure including an inner circuit layer, a first dielectric layer, a first conductive material layer, a second conductive layer, a second dielectric layer, a second conductive material layer, and a third conductive layer. The inner circuit layer has an upper surface and a first conductive layer disposed on the upper surface. The first dielectric layer is disposed on the inner circuit layer and covers the upper surface and the first conductive layer. The first dielectric layer has a first surface and a plurality of first circuit grooves extending from the first surface to the first conductive layer. An extension direction of the first circuit grooves is perpendicular to an extension direction of the first conductive layer. The first conductive material layer is disposed in the first circuit grooves. The second conductive layer is disposed on the first surface of the first dielectric layer, and includes a signal trace and at least two reference traces. The signal trace is located between the reference traces, and is not connected to the reference traces. The reference traces are electrically connected to the first conductive layer through the first conductive material layer. A width of each reference trace is larger than a width of each of the first circuit grooves. The second dielectric layer is disposed on the first dielectric layer, and covers the first surface and the second conductive layer. The second dielectric layer has a second surface and a plurality of second circuit grooves extending from the second surface to the reference traces. An extension direction of the second circuit grooves is perpendicular to an extension direction of the second conductive layer. A width of each of the second circuit grooves is less than a width of each of the reference traces. The second conductive material layer is disposed in the second circuit grooves. The third conductive layer is disposed on the second surface of the second dielectric layer. The third conductive layer is electrically connected to the reference traces through the second conductive material layer. An extension direction of the third conductive layer, the extension direction of the first conductive layer, and the extension direction of the second conductive layer are the same.

In an embodiment of the invention, the first conductive layer, the first conductive material layer, the reference traces, the second conductive material layer, and the third conductive layer define a circular wall. The circular wall surrounds the signal trace.

In an embodiment of the invention, a vertical distance between the third conductive layer and the second conductive layer, a vertical distance between the second conductive layer and the first conductive layer, and horizontal distances between the signal trace and each reference trace are equal.

In an embodiment of the invention, the width of each of the first circuit grooves is between 5 micrometers and 50 micrometers. The width of each of the second circuit grooves is between 5 micrometers and 50 micrometers.

In an embodiment of the invention, a thickness of the first dielectric layer is between 5 micrometers and 60 micrometers. The thickness of the second dielectric layer is between 5 micrometers and 60 micrometers.

In an embodiment of the invention, a material of the first conductive material layer is the same as a material of the second conductive layer, and a material of the second conductive material layer is the same as a material of the third conductive layer.

The invention provides a method of manufacturing a circuit structure. The manufacturing method includes following steps. An inner circuit layer is provided. The inner circuit layer has an upper surface and a first conductive layer disposed on the upper surface. A first dielectric layer is formed on the inner circuit layer. The first dielectric layer covers the upper surface of the inner circuit layer and the first conductive layer, and has a first surface. A first laser ablating step is performed towards the first dielectric layer, so as to form a plurality of first circuit grooves extending from the first surface of the first dielectric layer to the first conductive layer. An extension direction of the first circuit grooves is perpendicular to an extension direction of the first conductive layer. The first conductive material layer is filled in the first circuit grooves, wherein the first conductive material layer fills the first circuit grooves. A second conductive layer is formed on the first surface of the first dielectric layer. The second conductive layer includes a signal trace and at least two reference traces. The signal trace is located between the reference traces, and is not connected to the reference traces. The reference traces are electrically connected to the first conductive layer through the first conductive material layer. A width of each reference trace is larger than a width of each of the first circuit grooves. A second dielectric layer is formed on the first dielectric layer. The second dielectric layer covers the first surface of the first dielectric layer and the second conductive layer, and includes a second surface. A second laser ablating step is performed towards the second dielectric layer, so as to form a plurality of second circuit grooves extending from the second surface of the second dielectric layer to the reference traces. An extension direction of the second circuit grooves is perpendicular to an extension direction of the second conductive layer. A width of each of the second circuit grooves is less than a width of each of the reference traces. The second conductive material layer is filled in the second circuit grooves, wherein the second conductive material layer fills the second circuit grooves. A third conductive layer is formed on the second surface of the second dielectric layer. The third conductive layer is electrically connected to the reference traces through the second conductive material layer. An extension direction of the third conductive layer, the extension of the first conductive layer, and the extension direction of the second conductive layer are the same.

In an embodiment of the invention, the first conductive layer, the first conductive material layer, the reference traces, the second conductive material layer, and the third conductive layer define a circular wall. The circular wall surrounds the signal trace.

In an embodiment of the invention, a vertical distance between the third conductive layer and the second conductive layer, a vertical distance between the second conductive layer and the first conductive layer, and a horizontal distance between the signal trace and each reference trace are equal.

In an embodiment of the invention, the step of forming the second conductive layer includes the following steps. When the first conductive material layer is filled in the first circuit grooves, the first conductive material layer further extends to the first surface of the first dielectric layer and covers the first surface. And, a subtractive process is performed towards a portion of the first conductive material layer located on the first surface of the first dielectric layer, so as to form the second conductive layer.

In an embodiment of the invention, the step of forming the third conductive layer includes the following steps. When the second conductive material layer is filled in the second circuit grooves, the second conductive material layer further extends to the second surface of the second dielectric layer and covers the second surface. And, a subtractive process is performed towards a portion of the second conductive material layer located on the second surface of the second dielectric layer, so as to form the third conductive layer.

In an embodiment of the invention, the signal trace and the reference traces are simultaneously formed during the same step.

In an embodiment of the invention, the method of filling the first conductive material layer and the second conductive material layer includes an electroplating method.

Based on the above, the signal trace of the second conductive layer of the invention is located between reference traces, and the top and bottom sides of the signal trace respectively dispose the third conductive layer and the first conductive layer. In addition, the first conductive layer, the reference traces, and the third conductive layer are connected to each other through the first conductive material layer and the second conductive material layer. That is to say, the signal trace is surrounded by the first conductive layer, the first conductive material layer, the reference traces, the second conductive material layer, and the third conductive layer. Thus, the design of the circuit structure of the invention can prevent a cross-talk effect from happening between the signal trace and other adjacent signal traces. Not only is the cross-talk interference effectively reduced and the signal transmission quality improved, external electromagnetic interference towards the signal trace can be blocked, so as to effectively lower electromagnetic interference.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
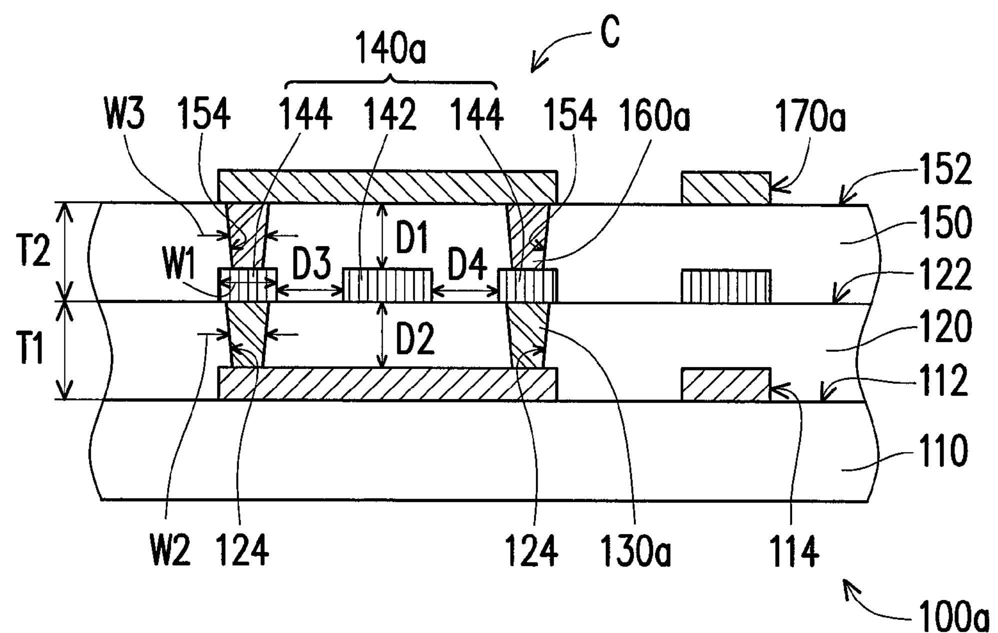
FIG. 1A is a schematic cross-sectional view of a circuit structure according to an embodiment of the invention.
Figure 1B:
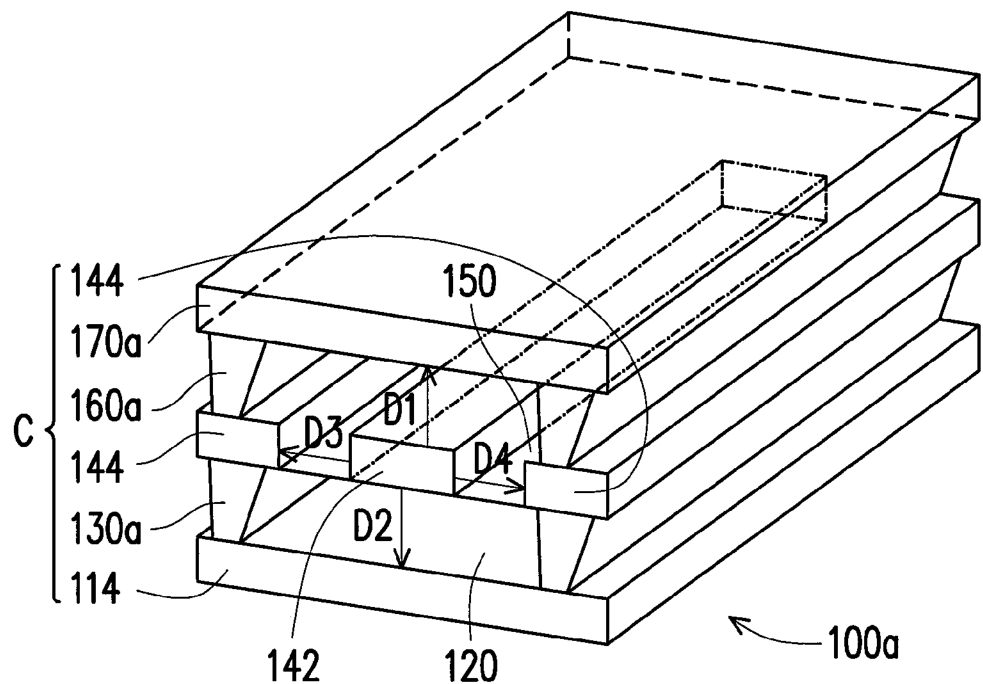
FIG. 1B illustrates a partial three-dimensional schematic view of the circuit structure of FIG. 1A.

FIG. 1A is a schematic cross-sectional view of a circuit structure according to an embodiment of the invention. FIG. 1B illustrates a partial three-dimensional schematic view of the circuit structure of FIG. 1A. Referring to FIG. 1A and FIG. 1B, in an embodiment, a circuit structure 100*a* includes an inner circuit layer 110, a first dielectric layer 120, a first conductive material layer 130*a*, a second conductive layer 140*a*, a second dielectric layer 150, a second conductive material layer 160*a*, and a third conductive layer 170*a*.

In detail, the inner circuit layer 110 has an upper surface 112 and a first conductive layer 114 disposed on the upper surface 112. The first dielectric layer 120 is disposed on the inner circuit layer 110 and covers the upper surface 112 and the first conductive layer 114. The first dielectric layer 120 has a first surface 122 and a plurality of first circuit grooves 124 extending from the first surface 122 to the first conductive layer 114. An extension direction of the first circuit grooves 124 is perpendicular to an extension direction of the first conductive layer 114. The first conductive material layer 130*a* is disposed in the first circuit grooves 124. The second conductive layer 140*a* is disposed on the first surface 122 of the first dielectric layer 120, and includes a signal trace 142 and at least two reference traces 144. The signal trace 142 is located between the reference traces 144, and the signal trace 142 is not connected to the reference traces 144. The reference traces 144 are electrically connected to the first conductive layer 114 through the first conductive material layer 130*a*. A width W1 of each reference trace 144 is larger than a width W2 of each of the first circuit grooves 124. The width W2 of each of the first circuit grooves 124 is, for example, between 5 micrometers and 50 micrometers. The second dielectric layer 150 is disposed on the first dielectric layer 120, and covers the first surface 122 and the second conductive layer 140*a*. The second dielectric layer 150 has a second surface 152 and a plurality of second circuit grooves 154 extending from the second surface 152 to the reference traces 144. An extension direction of the reference traces 154 is substantially perpendicular to an extension direction of the second conductive layer 140*a*. A width W3 of each of the second circuit grooves 154 is less than the width W1 of each of the reference traces 114. The width W3 of each of the second circuit grooves 154 is, for example, between 5 micrometers and 50 micrometers. The second conductive material layer 160*a* is disposed in the second circuit grooves 154. The third conductive layer 170*a* is disposed on the second surface 152 of the second dielectric layer 150. The third conductive layer 170*a* is electrically connected to the reference traces 144 through the second conductive material layer 160*a*. An extension direction of the third conductive layer 170*a*, the extension direction of the first conductive layer 114, and the extension direction of the second conductive layer 140*a* are substantially the same.

Specifically, the first conductive layer 114, the second conductive layer 140*a*, and the third conductive layer 170*a* of the embodiment are respectively a patterned conductive layer. The first circuit grooves 124 of the first dielectric layer 120 extend from the first surface 122 to a portion of the first conductive layer 114. The first conductive material layer 130*a* is filled in the first circuit grooves 124, and the reference traces 144 are electrically connected to the first conductive layer 114 through the first conductive material layer 130*a*. The first circuit grooves 154 of the first dielectric layer 150 extend from the second surface 152 to a portion of the second conductive layer 140*a*. The second conductive material layer 160*a* is filled in the second circuit grooves 154, and the third conductive layer 170*a* is electrically connected to the reference traces 144 through the second conductive material layer 160*a*. Specifically, the first conductive layer 114, the first conductive material layer 130*a*, the reference traces 144, the second conductive material layer 160*a*, and the third conductive layer 170*a* define a circular wall C. The circular wall C surrounds the signal trace 142. A vertical distance D1 between the third conductive layer 170*a* and the second conductive layer 140*a*, a vertical distance D2 between the second conductive layer 140*a* and the first conductive layer 114, and horizontal distances D3, D4 between the signal trace 142 and each reference trace 144 are equal. The thickness T1 of the first dielectric layer 120 is, for example, between 5 micrometers and 60 micrometers. The thickness T2 of the second dielectric layer 150 is, for example, between 5 micrometers and 60 micrometers.

It should be noted that the embodiment does not limit the material of the first conductive material layer 130*a*, the second conductive layer 140*a*, the second conductive material layer 160*a*, and the third conductive layer 170*a*, even though herein discloses that the material of the first conductive material layer 130*a* and the material of the second conductive layer 140*a* are the same, and the material of the second conductive material layer 160*a* and the material of the third conductive layer 170*a* are the same. However, in other embodiments, the material of the first conductive material layer 130*a* and the material of the second conductive layer 140*a* can also be different, and the material of the second conductive material layer 160*a* and the material of the third conductive layer 170*a* can be different. The different selection of material can be adopted by the invention, and does not depart from the scope or spirit of the invention.

The signal trace 142 of the second conductive layer 140*a* of the invention is located between reference traces 144, and the top and bottom sides of the signal trace 142 respectively dispose the third conductive layer 170*a* and the first conductive layer 114. In addition, the first conductive layer 114, the reference traces 144, and the third conductive layer 170*a* are connected to each other through the first conductive material layer 130*a* and the second conductive material layer 160*a*. That is to say, the signal trace 142 is surrounded by the circular wall C defined by the first conductive layer 114, the first conductive material layer 130*a*, the reference traces 144, the second conductive material layer 160*a*, and the third conductive layer 170*a*. Thus, the design of the circuit structure 100*a* of the invention can prevent a cross-talk effect from happening between the signal trace 142 and other adjacent signal traces. Not only is the cross-talk interference effectively reduced and the signal transmission quality improved, external electromagnetic interference towards the signal trace can be blocked, so as to effectively lower electromagnetic interference. In addition, a vertical distance D1 between the third conductive layer 170*a* and the second conductive layer 140*a*, a vertical distance D2 between the second conductive layer 140*a* and the first conductive layer 114, and horizontal distances D3, D4 between the signal trace 142 and each reference trace 144 are equal. In other words, the circular wall C and the signal trace 142 are arranged with a coaxial design. That is to say, the distances between the signal trace 142 and the first conductive layer 114, the reference traces 144, or the third conductive layer 170*a* are all the same. Thus, the circuit structure 100*a* of the embodiment can effectively lower cross-talk interference and electromagnetic interference, and has better signal completeness.

Up to here, only the structure of the circuit structure 100*a* of the invention is described. A process of manufacturing the circuit structure 100*a* of the invention is not yet provided. Accordingly, the following two embodiments describe methods of manufacturing the circuit structure 100*a*. Methods of manufacturing the circuit structures 100*a*, 100*b* are described along with FIGS. 2A to 2G and FIGS. 3A to 3D.

Figure 2A:
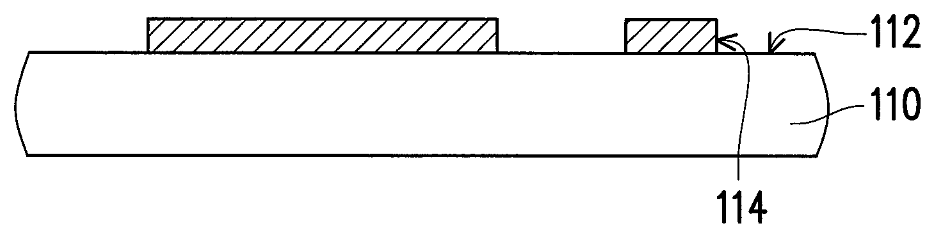
FIG. 2A to FIG. 2G are schematic cross-sectional views illustrating a process for manufacturing a circuit structure according to an embodiment of the invention.

FIG. 2A to FIG. 2G are schematic cross-sectional views illustrating a process for manufacturing a circuit structure according to an embodiment of the invention. Referring to FIG. 2A, in the manufacturing method of the circuit structure 100*a* according to the embodiment, first please refer to FIG. 2A. An inner circuit layer 110 is provided. The inner circuit layer 110 has an upper surface 112 and a first conductive layer 114 disposed on the upper surface 112. In detail, the inner circuit layer 110 is, for example, made up of at least one insulating layer (not shown) and at least one conductive layer (not shown). The first conductive layer 114 is, for example, a patterned conductive layer. The first conductive layer 114 is disposed on the upper surface 112, and exposes a portion of the upper surface 112.

Figure 2B:
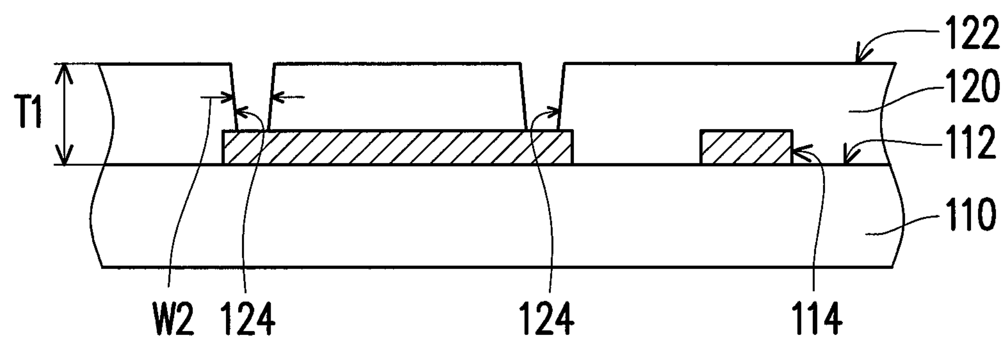

Next, referring to FIG. 2B, a first dielectric layer 120 is formed on the inner circuit layer 110. The first dielectric layer 120 covers the upper surface 112 of the inner circuit layer 110 and the first conductive layer 114, and has a first surface 122. In the embodiment, the material of the first dielectric layer 120 is, for example, polyimide (PI), ABF (Ajinomoto build-up film), or Liquid Crystalline Polymer (LCP). In addition, the first dielectric layer 120 has a thickness T1 between, for example, 5 micrometers and 60 micrometers.

Next, referring to FIG. 2B, a first laser ablating step is performed towards the first dielectric layer 120, so as to form a plurality of first circuit grooves 124 extending from the first surface 122 of the first dielectric layer 120 to the first conductive layer 114. In particular, an extension direction of the first circuit grooves 124 is perpendicular to an extension direction of the first conductive layer 114. A width W2 of each of the first circuit grooves 124 gradually decreases from the first surface 122 to the first conductive layer 114.

Figure 2C:
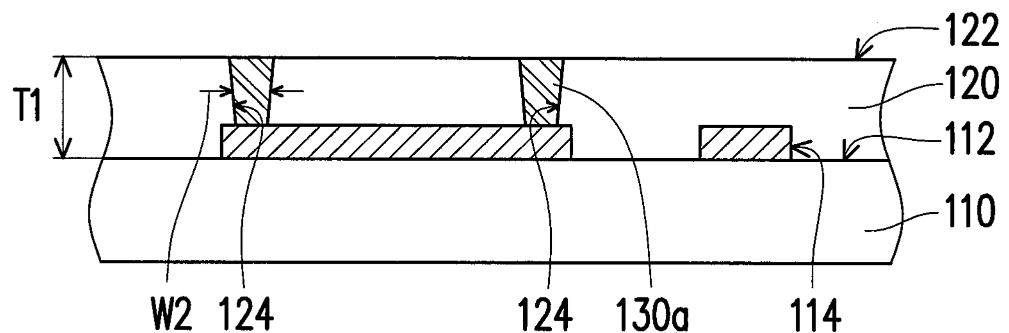

Next, referring to FIG. 2C, the first conductive material layer 130*a* is filled in the first circuit grooves 124, wherein the first conductive material layer 130*a* fills the first circuit grooves 124. In the embodiment, the method of filling the first conductive material layer 130*a* in the first circuit grooves 124 is, for example, an electroplating method.

Figure 2D:
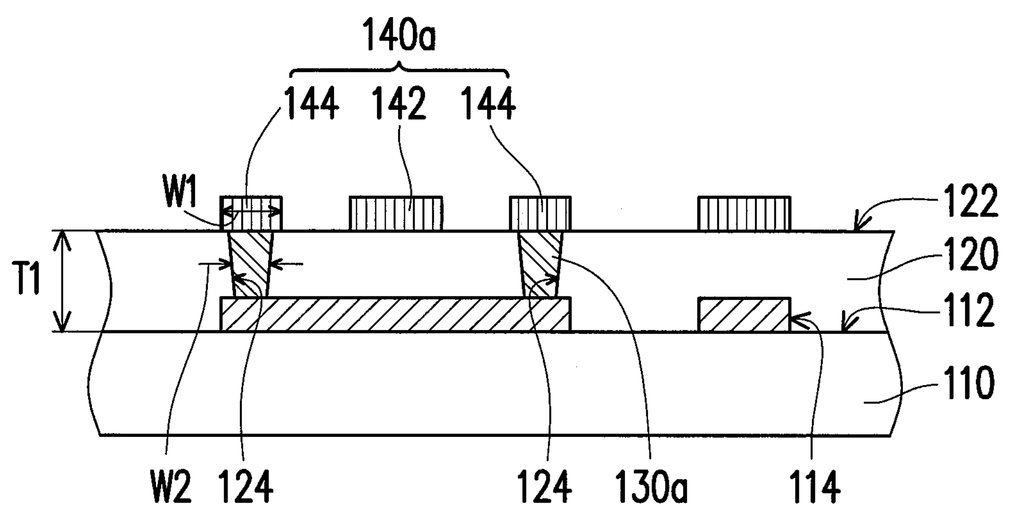

Next, referring to FIG. 2D, a second conductive layer 140*a* is formed on the first surface 122 of the first dielectric layer 120. The second conductive layer 140*a* includes a signal trace 142 and at least two reference traces 144. The second conductive layer 140*a* extends in the same direction as the first conductive layer 114. In detail, the signal trace 142 is located between the reference traces 144, and the signal trace 142 is not connected to the reference traces 144. Herein, a material of the first conductive material layer 130*a* and a material of the second conductive layer 140*a* can be the same or different. Specifically, the signal trace 142 and the reference traces 144 are formed during the same step at the same time. The reference traces 144 are electrically connected to the first conductive layer 114 through the first conductive material layer 130*a*. A width W1 of each reference trace 144 is larger than a width W2 of each of the first circuit grooves 124. Even better, the width W2 of the first circuit grooves 124 is, for example, between 5 micrometers and 50 micrometers.

It should be noted that the second conductive layer 140*a* of the embodiment is, for example, a patterned conductive layer. The second conductive layer 140*a* is, for example, formed through a semi-additive process. Since first circuit grooves 124 of the embodiment are formed through a laser ablating step, thus when compared to the method of forming the second conductive layer 140*a*, the width W2 of the first circuit grooves 124 of the embodiment are clearly smaller than the width W1 of the reference traces 144 of the second conductive layer 140*a*.

Figure 2E:
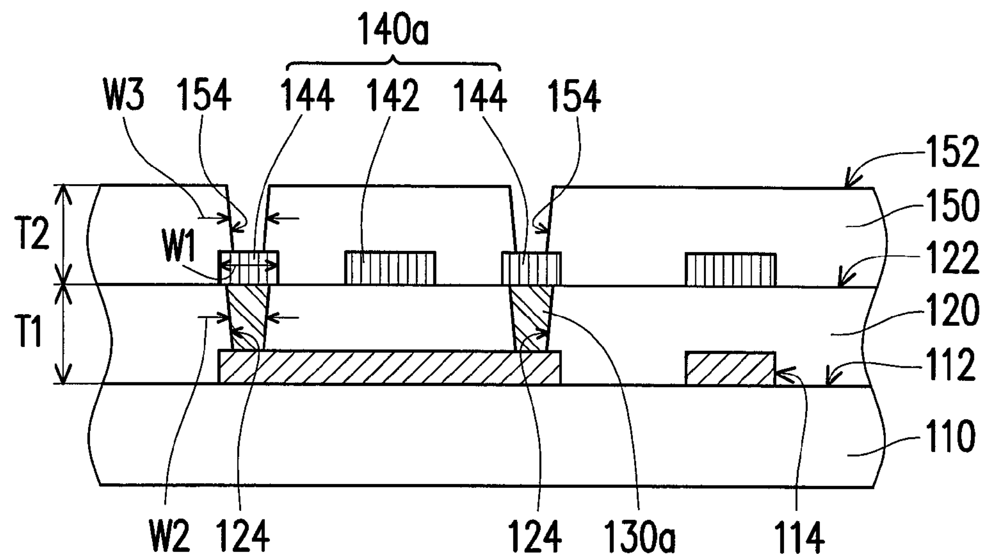

Next, referring to FIG. 2E, a second dielectric layer 150 is formed on the first dielectric layer 120. The second dielectric layer 150 covers the first surface 122 of the first dielectric layer 120 and the second conductive layer 140*a*, and has a second surface 152. In the embodiment, the material of the second dielectric layer 150 is, for example, polyimide (PI), ABF (Ajinomoto build-up film), or Liquid Crystalline Polymer (LCP). In addition, the second dielectric layer 150 has a thickness T2 between, for example, 5 micrometers and 60 micrometers.

Next, further referring to FIG. 2E, a second laser ablating step is performed towards the second dielectric layer 150, so as to form a plurality of second circuit grooves 154 extending from the second surface 152 of the second dielectric layer 150 to the reference traces 144. In particular, an extension direction of the second circuit grooves 154 is perpendicular to an extension direction of the second conductive layer 140*a*. A width W3 of each of the second circuit grooves 154 is less than a width W1 of each of the reference traces 144. Preferably, the width W3 of the second circuit grooves 154 is, for example, between 5 micrometers and 50 micrometers. In detail, the width W3 of the second circuit grooves 154 gradually decrease from the second surface 152 of the second dielectric layer 150 to the reference traces 144.

Figure 2F:
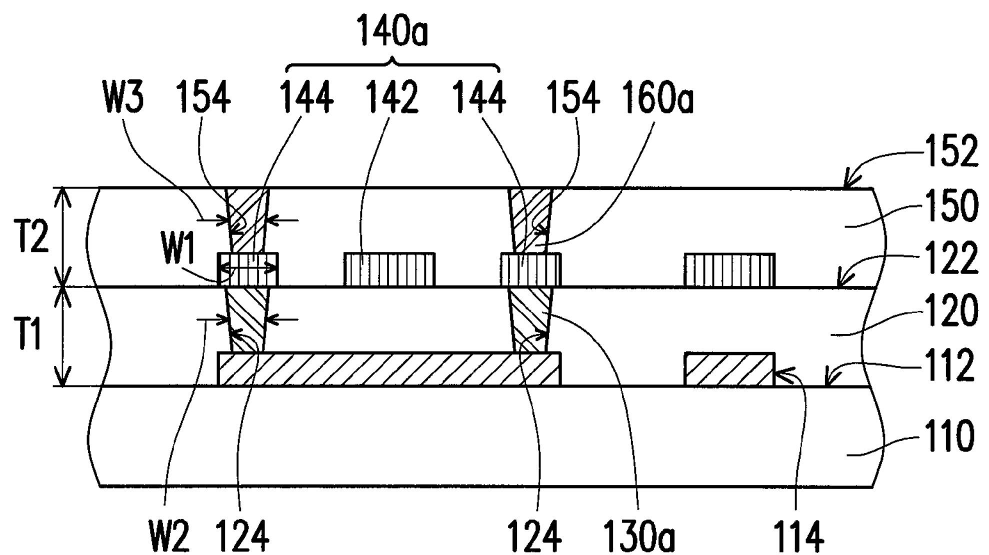

Next, referring to FIG. 2F, the second conductive material layer 160*a* is filled in the second circuit grooves 154, wherein the second conductive material layer 160*a* fills the second circuit grooves 154. In the embodiment, the method of filling the second conductive material layer 160*a* in the second circuit grooves 154 is, for example, an electroplating method.

Figure 2G:
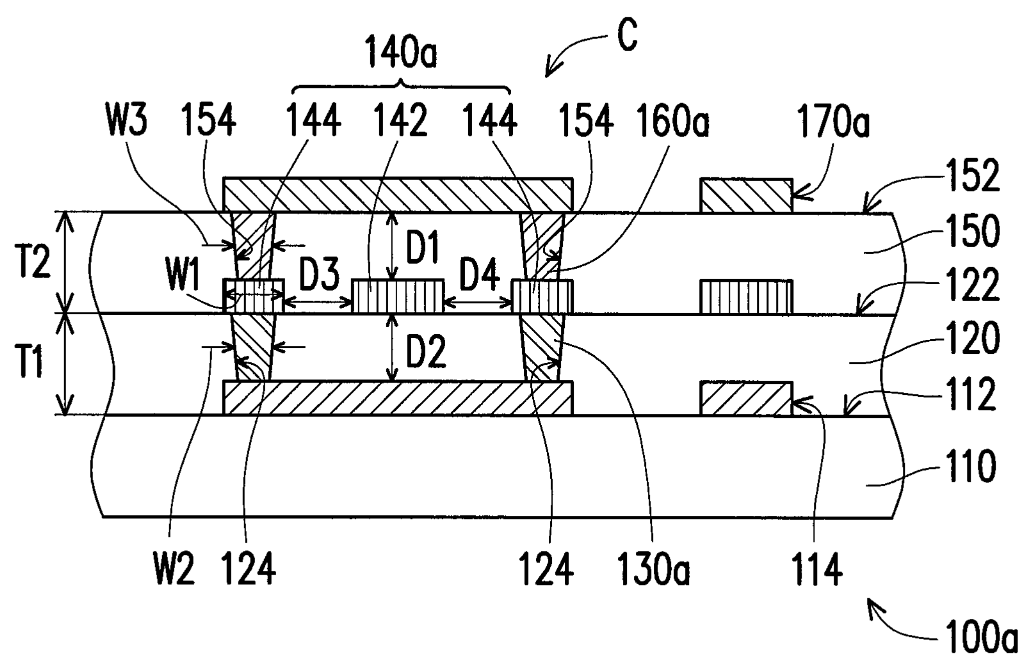

Finally, referring to FIG. 2G, a third conductive layer 170*a* is formed on the second surface 152 of the second dielectric layer 150. The third dielectric layer 170*a* is electrically connected to the reference traces 144 of the second conductive layer 140*a* through the second conductive material layer 160*a*. An extension direction of the third conductive layer 170*a*, an extension of the first conductive layer 114, and an extension direction of the second conductive layer 140*a* are the same. It should be noted that the third conductive layer 170*a* of the embodiment is, for example, a patterned conductive layer. The third conductive layer 170*a* is, for example, formed through a semi-additive process. Herein, a material of the second conductive material layer 160*a* and a material of the third conductive layer 170*a* can be the same or different. Specifically, in the embodiment, the first conductive layer 114, the first conductive material layer 130*a*, the reference traces 144, the second conductive material layer 160*a*, and the third conductive layer 170*a* define a circular wall C. The circular wall C surrounds the signal trace 142. A vertical distance D1 between the third conductive layer 170*a* and the second conductive layer 140*a*, a vertical distance D2 between the second conductive layer 140*a* and the first conductive layer 114, and horizontal distances D3, D4 between the signal trace 142 and each reference trace 144 are equal. Herein, the manufacture of the circuit structure 100*a* is complete.

The embodiment uses a laser ablating method to form the first circuit grooves 124 and the second circuit grooves 154. Thus, when comparing the widths W2, W3 of the first circuit grooves 124 and the second circuit grooves 154 to the width W1 of the reference traces 144 of the second conductive layer 140*a* formed through a semi-additive process, the width W2 of the first circuit grooves 124 and the width W3 of the second circuit grooves 154 are clearly smaller than the width W1 of the reference traces 144. Furthermore, the width W1 of the reference traces 144 are clearly greater than the width W2 of the first circuit grooves 124 and the width W3 of the second circuit grooves 154. Thus the reference traces 144 can not only be a pair of alignment traces, so as to improve the alignment between the second circuit grooves 154 and the first circuit grooves 124, but can also be block points for laser ablating, so as to prevent damaging the first conductive material layer 130*a*. In addition, a vertical distance D1 between the third conductive layer 170*a* and the second conductive layer 140*a*, a vertical distance D2 between the second conductive layer 140*a* and the first conductive layer 114, and horizontal distances D3, D4 between the signal trace 142 and each reference trace 144 are equal. In other words, the circular wall C and the signal trace 142 are arranged with a coaxial design. That is to say, the distances between the signal trace 142 and the first conductive layer 114, the reference traces 144, or the third conductive layer 170*a* are all the same. Thus, the design of the circuit structure 100*a* of the invention can prevent a cross-talk effect from happening between the signal trace 142 and other adjacent signal traces. Not only is the cross-talk interference effectively reduced and the signal transmission quality improved, external electromagnetic interference towards the signal trace can be blocked, so as to effectively lower electromagnetic interference.

FIG. 3A to FIG. 3D are a schematic cross-sectional views illustrating partial steps of a process for manufacturing a circuit structure according to another embodiment of the invention. The embodiment uses the same reference numerals and a portion of the content of the previous embodiment. The same reference numerals represent similar components, and repeated description is omitted. Those not described in the embodiment can be referred to in the above embodiment.

Figure 3A:
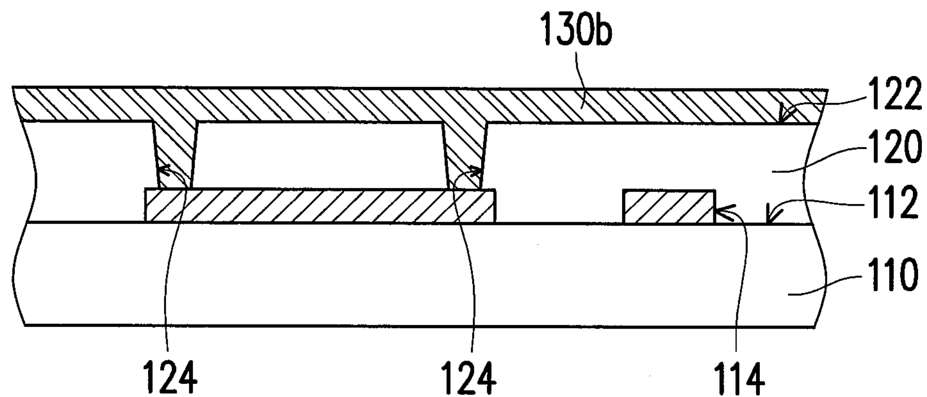
FIG. 3A to FIG. 3D are a schematic cross-sectional views illustrating partial steps of a process for manufacturing a circuit structure according to another embodiment of the invention.
Figure 3B:
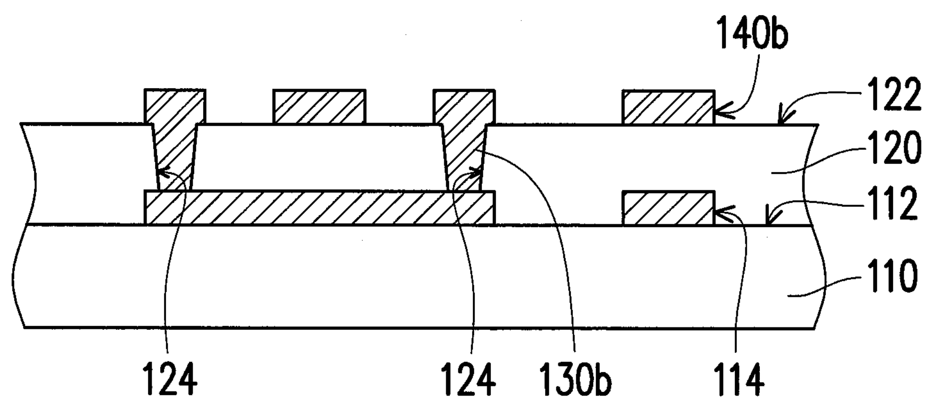
Figure 3C:
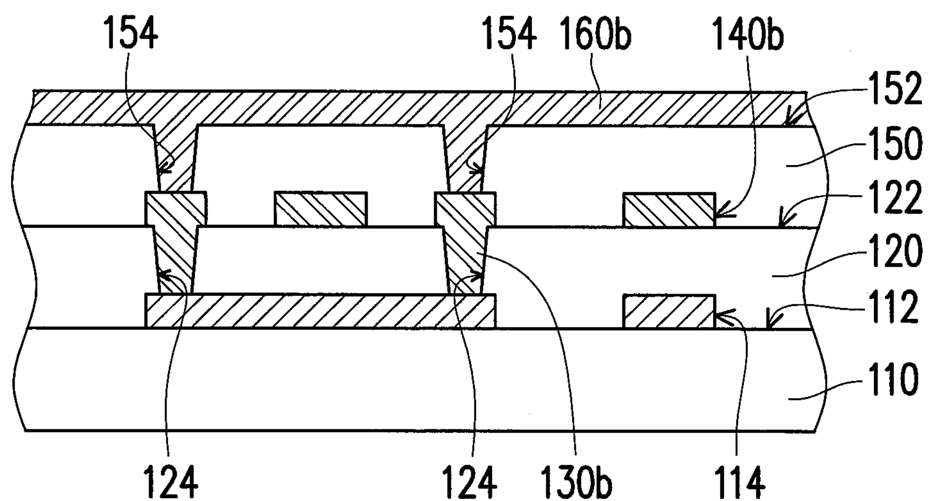
Figure 3D:
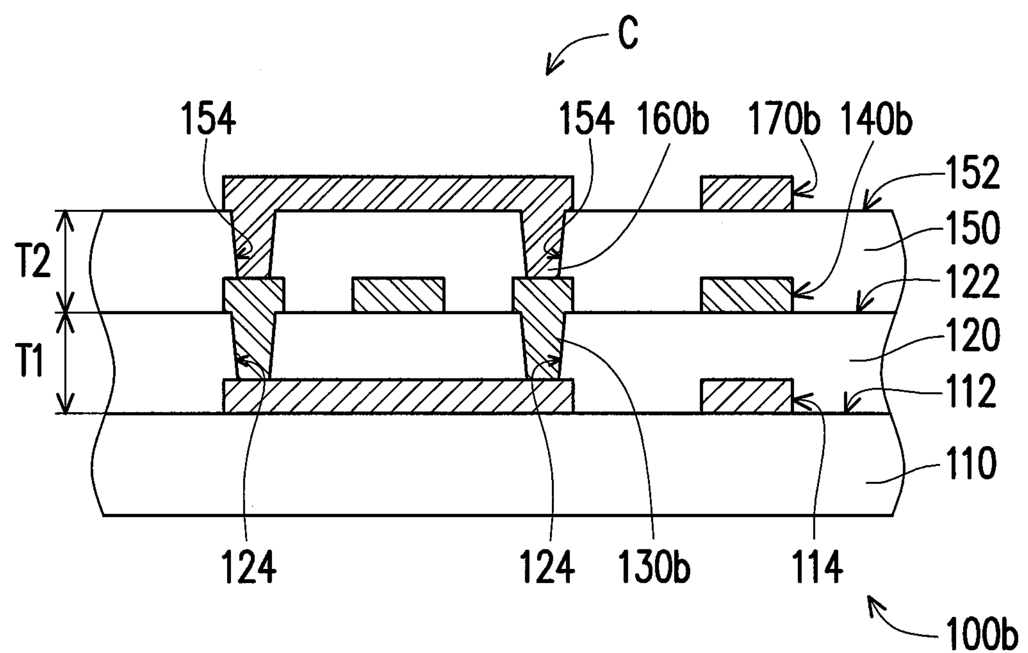

Referring to FIG. 3D, the main difference between a circuit structure 100*b* of the embodiment and the circuit structure 100*a* of the previous embodiment is that in circuit structure 100*b* of FIG. 3D, the material of the first conductive material layer 130*a* is the same as the material of the second conductive layer 140*b*, and a material of the second conductive material layer 160*a* is the same as the material of the third conductive layer 170*b*.

During manufacturing, the circuit structure 100*b* of the embodiment can adopt most of the manufacturing method of the circuit structure 100*a* of the previous embodiment. After the step of FIG. 2B, or the forming of the first circuit grooves 124, please refer to FIG. 3A. When filling a first conductive material layer 130*b* in the first circuit grooves 124, the first conductive material layer 130*b* further extends to the first surface 122 of the first dielectric layer 120, and covers the first surface 122. Next, referring to FIG. 3B, a subtractive process is performed towards a portion of the first conductive material layer 130*b* located on the first surface 122 of the first dielectric layer 120, so as to form the second conductive layer 140*b*. Next, further referring to FIG. 2E, or after forming the second circuit grooves 154, please refer to FIG. 3C. When filling a second conductive material layer 160*b* in the second circuit grooves 154, the second conductive material layer 160*b* further extends to the second surface 152 of the second dielectric layer 150, and covers the second surface 152. Next, referring to FIG. 3D, a subtractive process is performed towards a portion of the second conductive material layer 160*b* located on the second surface 152 of the second dielectric layer 150, so as to form the third conductive layer 170*b*. Herein, the manufacture of the circuit structure 100*b* is complete.

To sum up, the signal trace of the second conductive layer of the invention is located between reference traces, and the top and bottom sides of the signal trace respectively dispose the third conductive layer and the first conductive layer. In addition, the first conductive layer, the reference trace, and the third conductive layer are connected to each other through the first conductive material layer and the second conductive material layer. That is to say, the signal trace is surrounded by the first conductive layer, the first conductive material layer, the reference trace, the second conductive material layer, and the third conductive layer. Thus, the design of the circuit structure of the invention can prevent a cross-talk effect from happening between the signal trace and other adjacent signal traces. Not only is the cross-talk interference effectively reduced and the signal transmission quality improved, external electromagnetic interference towards the signal trace can be blocked, so as to effectively lower electromagnetic interference. Furthermore, the invention uses a laser ablating method to form the first circuit grooves and the second circuit grooves. Thus, when comparing the widths of the first circuit grooves and the second circuit grooves to the width of the reference traces of the second conductive layer formed through a semi-additive process, the width of the first circuit grooves and the width of the second circuit grooves are clearly smaller than the width of the reference traces. In addition, the widths of the reference traces are clearly greater than the width of the first circuit grooves and the width of the second circuit grooves. Thus the reference traces can not only be a pair of alignment traces, so as to improve the alignment between the second circuit grooves and the first circuit grooves, but can also be block points for laser ablating, so as to prevent damaging the first conductive material layer.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit structure, comprising:

an inner circuit layer, having an upper surface and a first conductive layer disposed on the upper surface;

a first dielectric layer, disposed on the inner circuit layer and covering the upper surface and the first conductive layer, wherein the first dielectric layer includes a first surface and a plurality of first circuit grooves extending from the first surface to the first conductive layer, an extension direction of the first circuit grooves is perpendicular to an extension direction of the first conductive layer;

a first conductive material layer, disposed in the first circuit grooves;

a second conductive layer, disposed on the first surface of the first dielectric layer, and including a signal trace and at least two reference traces, wherein the signal trace is located between the reference traces, and the signal trace is not connected to the reference traces, the reference traces are electrically connected to the first conductive layer through the respective first conductive material layer, and a width of each of the reference traces is greater than a width of each of the first circuit grooves;

a second dielectric layer, disposed on the first dielectric layer and covering the first surface and the second conductive layer, wherein the second dielectric layer includes a second surface and a plurality of second circuit grooves extending from the second surface to the reference traces, an extension direction of the second circuit grooves is perpendicular to an extension direction of the second conductive layer, and a width of each of the second circuit grooves is smaller than the width of each of the reference traces;

a second conductive material layer, disposed in the second circuit grooves; and a third conductive layer, disposed on the second surface of the second dielectric layer, wherein the third conductive layer is electrically connected to the reference traces through the respective second conductive material layer, and an extension direction of the third conductive layer, the extension direction of the first conductive layer, and the extension direction of the second conductive layer are the same, wherein the first conductive layer, the respective first conductive material layer, the reference traces, the respective second conductive material layer, and the third conductive layer define a closed circular wall, and the closed circular wall surrounds the signal trace.

2. The circuit structure as claimed in claim 1, wherein a vertical distance between the third conductive layer and the second conductive layer, a vertical distance between the second conductive layer and the first conductive layer, and a horizontal distance between the signal trace and each of the reference traces are equal.

3. The circuit structure as claimed in claim 1, wherein the width of the first circuit grooves is between 5 micrometers and 50 micrometers, and the width of the second circuit grooves is between 5 micrometers and 50 micrometers.

4. The circuit structure as claimed in claim 1, wherein a thickness of the first dielectric layer is between 5 micrometers and 60 micrometers, and a thickness of the second dielectric layer is between 5 micrometers and 60 micrometers.

5. The circuit structure as claimed in claim 1, wherein a material of the respective first conductive material layer is the same as a material of the second conductive layer, and a material of the respective second conductive material layer is the same as a material of the third conductive layer.

6. A method of manufacturing a circuit structure, comprising:

providing an inner circuit layer, wherein the inner circuit layer includes an upper surface and a first conductive layer disposed on the upper surface;

forming a first dielectric layer on the inner circuit layer, wherein the first dielectric layer covers the upper surface of the inner circuit layer and the first conductive layer, and has a first surface;

performing a first laser ablating step towards the first dielectric layer, so as to form a plurality of first circuit grooves extending from the first surface of the first dielectric layer to the first conductive layer, wherein an extension direction of the first circuit grooves is perpendicular to an extension direction of the first conductive layer;

filling a first conductive material layer in the first circuit grooves, wherein the respective first conductive material layer fills the first circuit grooves;

forming a second conductive layer on the first surface of the first dielectric layer, wherein the second conductive layer includes a signal trace and at least two reference traces, the signal trace is located between the reference traces, and the signal trace is not connected to the reference traces, the reference traces are electrically connected to the first conductive layer through the respective first conductive material layer, and a width of each of the reference traces is greater than a width of each of the first circuit grooves;

forming a second dielectric layer on the first dielectric layer, wherein the second dielectric layer covers the first surface of the first dielectric layer and the second conductive layer, and has a second surface;

performing a second laser ablating step towards the second dielectric layer, so as to form a plurality of second circuit grooves extending from the second surface of the second dielectric layer to the reference traces, wherein an extension direction of the second circuit grooves is perpendicular to an extension direction of the second conductive layer, and a width of each of the second circuit grooves is smaller than the width of each of the reference traces;

filling a second conductive material layer in the second circuit grooves, wherein the respective second conductive material layer fills the second circuit grooves; and forming a third conductive layer on the second surface of the second dielectric layer, wherein the third conductive layer is electrically connected to the reference traces through the respective second conductive material layer, and an extension direction of the third conductive layer, the extension direction of the first conductive layer, and the extension direction of the second conductive layer are the same, wherein the first conductive layer, the respective first conductive material layer, the reference traces, the respective second conductive material layer, and the third conductive layer define a closed circular wall, and the closed circular wall surrounds the signal trace.

7. The method of manufacturing the circuit structure as claimed in claim 6, wherein a vertical distance between the third conductive layer and the second conductive layer, a vertical distance between the second conductive layer and the first conductive layer, and a horizontal distance between the signal trace and each of the reference traces are equal.

8. The method of manufacturing the circuit structure as claimed in claim 6, wherein the step of forming the second conductive layer comprises:

filling the respective first conductive material layer in the first circuit grooves, wherein the respective first conductive material layer further extends to the first surface of the first dielectric layer and covers the first surface; and performing a subtractive process towards a portion of the respective first conductive material layer located on the first surface of the first dielectric layer, so as to form the second conductive layer.

9. The method of manufacturing the circuit structure as claimed in claim 6, wherein the step of forming the third conductive layer comprises:

filling the respective second conductive material layer in the second circuit grooves, wherein the respective second conductive material layer further extends to the second surface of the second dielectric layer and covers the second surface; and performing a subtractive process towards a portion of the respective second conductive material layer located on the second surface of the second dielectric layer, so as to form the third conductive layer.

10. The method of manufacturing the circuit structure as claimed in claim 6, wherein the signal trace and the reference traces are formed during the same step at the same time.

11. The method of manufacturing the circuit board as claimed in claim 6, wherein a method of filling the respective first conductive material layer and the respective second conductive material layer comprises an electroplating method.

* * * * *